United States Patent
Rossin et al.

(10) Patent No.: US 7,602,828 B2
(45) Date of Patent: Oct. 13, 2009

(54) SEMICONDUCTOR LASER DIODE WITH NARROW LATERAL BEAM DIVERGENCE

(75) Inventors: Victor Rossin, Mountain View, CA (US); Matthew Glenn Peters, Menlo Park, CA (US); Erik Paul Zucker, Los Altos, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 17 days.

(21) Appl. No.: 11/938,511

(22) Filed: Nov. 12, 2007

(65) Prior Publication Data

US 2008/0112451 A1   May 15, 2008

Related U.S. Application Data

(60) Provisional application No. 60/865,502, filed on Nov. 13, 2006.

(51) Int. Cl.
*H01S 5/00*   (2006.01)

(52) U.S. Cl. .................. 372/45.01; 372/43.01; 372/87

(58) Field of Classification Search .............. 372/43.01, 372/45.01, 87
See application file for complete search history.

(56) References Cited

U.S. PATENT DOCUMENTS

| | | | | |
|---|---|---|---|---|
| 4,144,503 | A | | 3/1979 | Itoh et al. ............... 372/45.012 |
| 4,965,806 | A | | 10/1990 | Ashby et al. ............. 372/45.01 |
| 5,438,584 | A | * | 8/1995 | Paoli et al. ............... 372/45.01 |
| 5,499,260 | A | * | 3/1996 | Takahashi et al. ....... 372/46.015 |
| 6,256,330 | B1 | | 7/2001 | LaComb ................. 372/46.01 |

OTHER PUBLICATIONS

"Lateral Analysis of Quasi-Index-Guided injection Lasers: Transition from gain to Index Guiding", Agrawal, J. of Lightwave Technology, vol. LT-2, No. 4, pp. 537-543, 1984.

* cited by examiner

*Primary Examiner*—Dung T Nguyen
(74) *Attorney, Agent, or Firm*—Matthew A. Pequignot; Pequignot + Myers LLC

(57) ABSTRACT

The invention relates to high power broad-area semiconductor lasers incorporating a structure that provides both gain guiding and index guiding. The lateral width of the index guiding region is greater than the lateral width of the gain guiding region by at least 20 micron. This results in a high power broad-area semiconductor laser which has reduced lateral divergence of the output beam.

11 Claims, 8 Drawing Sheets

SEMICONDUCTOR LASER DIODE WITH NARROW LATERAL BEAM DIVERGENCE

CROSS-REFERENCE TO RELATED APPLICATIONS

The present invention claims priority from U.S. Provisional Patent Application No. 60/865,502 filed Nov. 13, 2006, entitled "Semiconductor Laser Diode with Narrow Lateral Beam Divergence", which is incorporated herein by reference.

TECHNICAL FIELD

A broad-area semiconductor laser is disclosed comprising gain-guiding and index-guiding in a single planar structure to decrease lateral divergence of the output laser beam.

BACKGROUND OF THE INVENTION

One of the important parameters characterizing laser diodes is the divergence of the output beam. The narrower the divergence, the brighter is the laser source, the easier it is to focus laser power and the more power that can be coupled into an optical fiber for fiber delivery of the laser power. In semiconductor diode lasers, divergence of the beam perpendicular to the epitaxial layers is defined by epitaxial layer refractive index profile design. Divergence of the beam in a plane parallel to the epitaxial layers of multi-mode broad area lasers is defined by the lateral shape of the multiple optical modes.

There are two basic structures which can provide lateral optical confinement in semiconductor lasers. One is a prior art gain-guided structure illustrated in FIG. 1. Semiconductor laser 100 comprises a substrate 101, on which a sequence of epitaxial layers is grown, starting with a n-cladding layer 102, followed by a n-waveguide layer 103, an active layer 104, a p-waveguide layer 105, a p-cladding layer 106 and finally a cap layer 107. The active layer 104 may consist of one or more sub-layers such as quantum wells.

Current I is injected into the semiconductor laser 100 through a stripe contact or electrode 108 of a certain width $W_1$. At currents higher than the laser threshold current $I_{th}$, an optical gain g(I) is achieved inside a pumped region under the stripe contact of the semiconductor laser structure. A complex refractive index N inside the pumped region becomes different from that of surrounding unpumped regions. The contrast in the complex refractive index thus created provides a lateral optical confinement in the gain-guided lasers.

Gain-guided lasers are easy to fabricate by deposition of blocking dielectric layers, ion implantation, or patterned metal contacts but they have relatively higher threshold currents and lower efficiencies.

Another way of providing lateral optical confinement is with an index-guided laser structure, such as in the example of FIG. 2a. A lateral profile of refractive index is introduced during laser fabrication by selective etch and regrowth of material with different index or selectively changing the index by vacancy induced or impurity induced disordering. Index-guided lasers have lower threshold and higher efficiency.

In FIG. 2a, semiconductor laser 200 comprises a substrate 201, on which a sequence of epitaxial layers is grown to form an optical waveguide with a perpendicular refractive index profile. The sequence starts with a n-cladding layer 202, followed by a n-waveguide layer 203, an active layer 204, a p-waveguide layer 205, a p-cladding layer 206 and finally a cap layer 207. The active layer 204 may consist of one or more sub-layers such as quantum wells.

The lateral profile of refractive index is formed under an index-guided stripe 209 of width $W_2$ by lowering the index of refraction in one or more of the various epitaxial layers, which are part of the optical waveguide. For example, in the top four layers 204-207, contiguous regions 204'-207', respectively, of lower refractive index are formed by one or more of the fabrication processes mentioned above.

Thus, lower index active regions 204', lower index p-waveguide regions 205', lower index p-clad regions 206', and lower index cap regions 207' constitute a confining region with a lower refractive index which provides the lateral optical confinement for guiding an optical beam in a lateral direction.

Various methods and structures have been applied to create lateral refractive index profiles for improving lateral guiding of lasing beams within semiconductor lasers.

Ashby (U.S. Pat. No. 4,965,806) teaches a semiconductor laser devices in which a lateral refractive index profile is induced by thermally heating regions adjacent to an active region to compensate for an effect of junction heating during operation.

This approach has a serious practical limitation for high-power lasers because the attendant problem of heat removal from the junction is further aggravated by the need to extract the additional heating used to thermally adjust the lateral refractive index profile.

Agrawal ("Lateral Analysis of Quasi-Index-Guided injection Lasers: Transition from gain to Index Guiding", J. of Lightwave Technology, vol. LT-2, No 4, pp. 537-543, 1984) describes a transition from gain-guided to index-guided mode of operation in lasers with current stripe and index stripe of the same widths. Since for both gain-guided and index-guided modes of operation the stripe width remains essentially the same, there is no practical improvement in the lateral beam divergence of the laser.

Itoh et al. (U.S. Pat. No. 4,144,503) discloses a laser structure, in which a Fabry-Perot cavity is embedded within a light guide.

In FIG. 2b (corresponding to Itoh's FIG. 2(c)), a plan view of a mesa part shows an active region 2 formed in the shape of a stripe 20 µm wide and 300 µm in length, with insulating film 8 surrounding all four side faces of the mesa part to separate it from a surrounding light guide part 11. Thus the index-guiding and gain-guiding stripes coincide.

Apart from the difficulty of fabricating buried optical mirrors of high quality for the Fabry-Perot cavity, Itoh's structure has the additional limitation that the insulating film 8 substantially increases the thermal resistance of the mesa part. The increased thermal resistance limits the maximum optical power at which the laser may be operated.

On the other hand, LaComb (U.S. Pat. No. 6,256,330) teaches an index guided semiconductor laser possessing both index tailoring and gain tailoring. In a Fabry-Perot cavity formed between cleaved facets, lateral optical confinement forming a lateral waveguide is created by a ridge. In the ridge structure, a step in refractive index is provided by the dielectric material deposited on the sides of the ridge, as well as the surrounding air. Semiconductor index of refraction values generally fall in the range from 3.0 to 4.0, whilst dielectric material has substantially lower refractive index values in the approximate range of 1.5 to 2.2, and air has practically 1.0, similar to the value in vacuum.

Current confinement which basically determines gain guiding can in theory be accomplished through selective doping of a p-type material in the n-type layers making up the waveguide. However, a parasitic p-n junction thus formed in the ridge provides a current leakage path, effectively increasing the width of the current path and laterally spreading the gain guiding to approximately the width of the ridge or even wider.

This structure also has thermal limitations in that the ridge constricts thermal flow, thereby substantially increasing the thermal resistance. The increased thermal resistance limits the maximum optical power at which the laser may be operated.

SUMMARY OF THE INVENTION

An object of the invention disclosed herein is to provide a high power broad-area semiconductor laser structure with a reduced lateral divergence of the output beam.

The described structure combines both gain guiding and index guiding in which the lateral width of the index guiding region is greater than the lateral width of the gain guiding region by at least 20 micron. This increase in the width of the index-guided stripe compared to the width of the gain-guided stripe results in significant narrowing of the lateral divergence of the optical output beam.

A combination of gain-guided and weakly index guided structures can thus be used to obtain advantages of both structures.

Another object of the invention is to achieve the reduced lateral divergence of the output beam in a planar laser structure. The planar structure can be advantageously used for more efficient thermal design by providing a lower thermal resistance. This is of particular interest in high power lasers, where the capacity to remove heat from an active area of the laser can limit its operating range.

BRIEF DESCRIPTION OF THE DRAWINGS

The invention will be described in greater detail with reference to the accompanying drawings which represent preferred embodiments thereof, wherein:

(FIG. 2(c), U.S. Pat. No. 4,144,503), showing a Fabry-Perot cavity embedded within a light guide;

Figure 1:
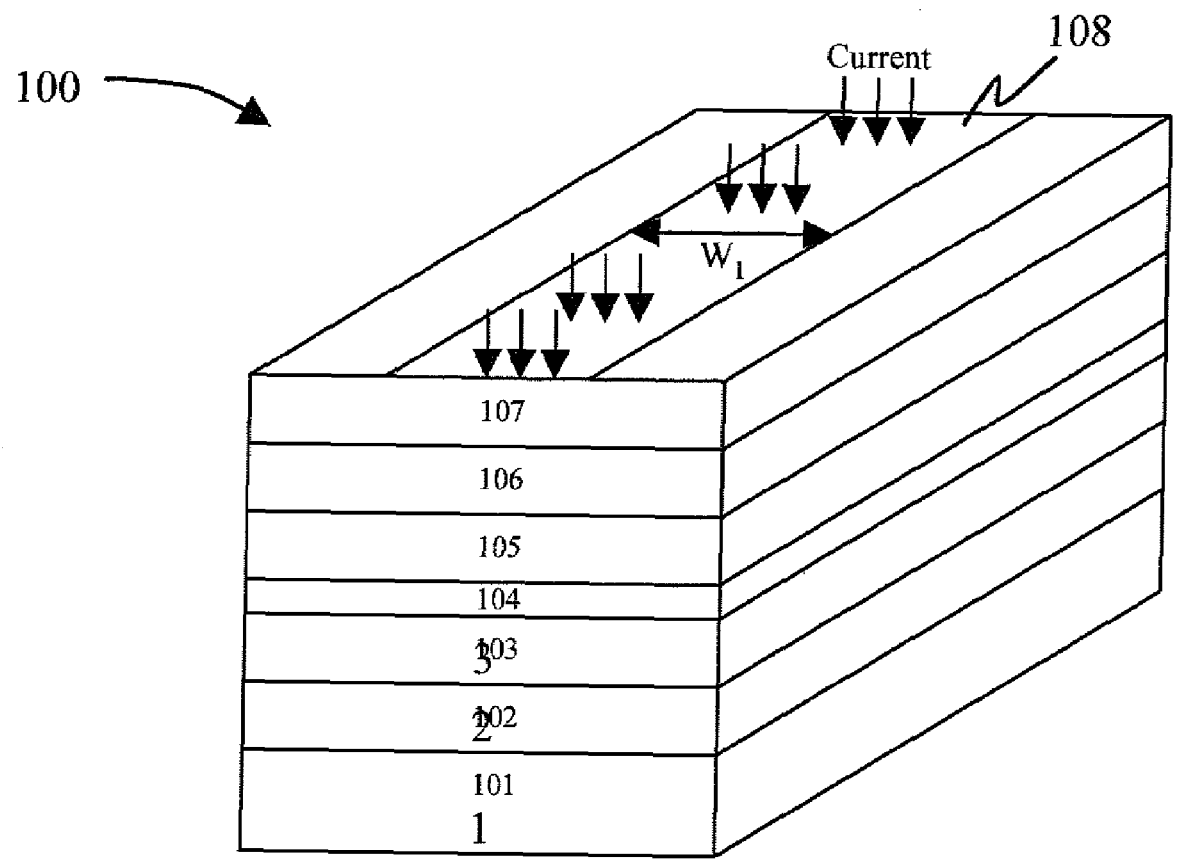
FIG. 1 is an isometric cross-sectional end view of a prior art example of a gain-guided laser.
Figure 2A:
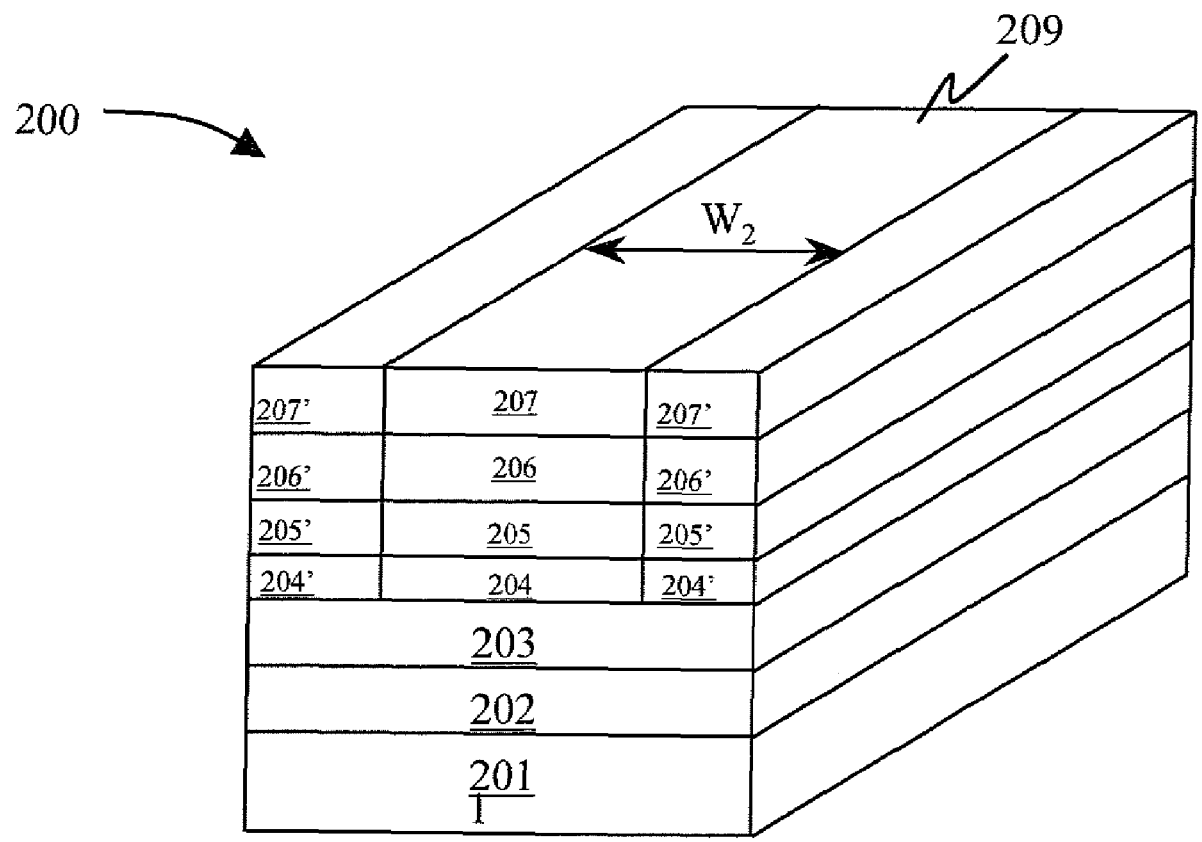
FIG. 2a is an isometric cross-sectional end view of a prior art example of an index-guided laser.
Figure 2B:
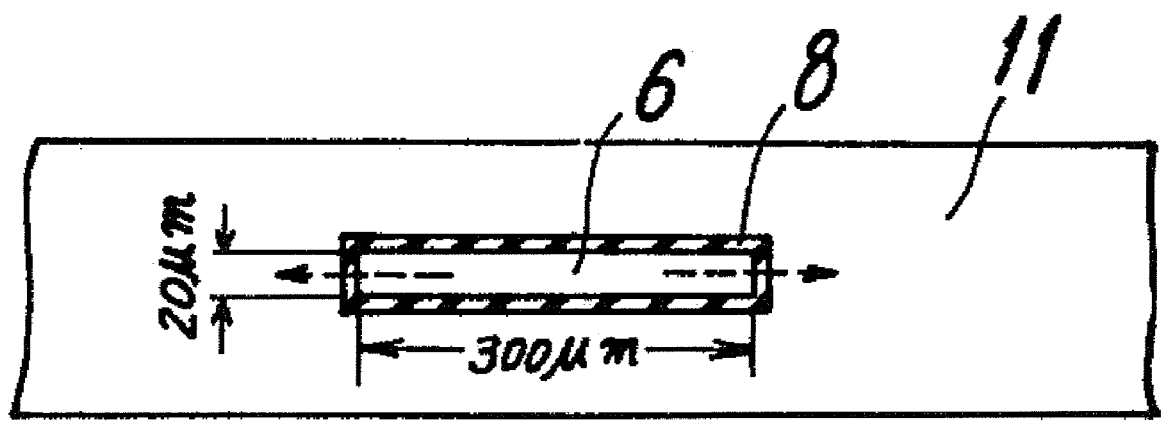
FIG. 2b is a plan view of a prior art example according to Itoh et al.
Figure 3:
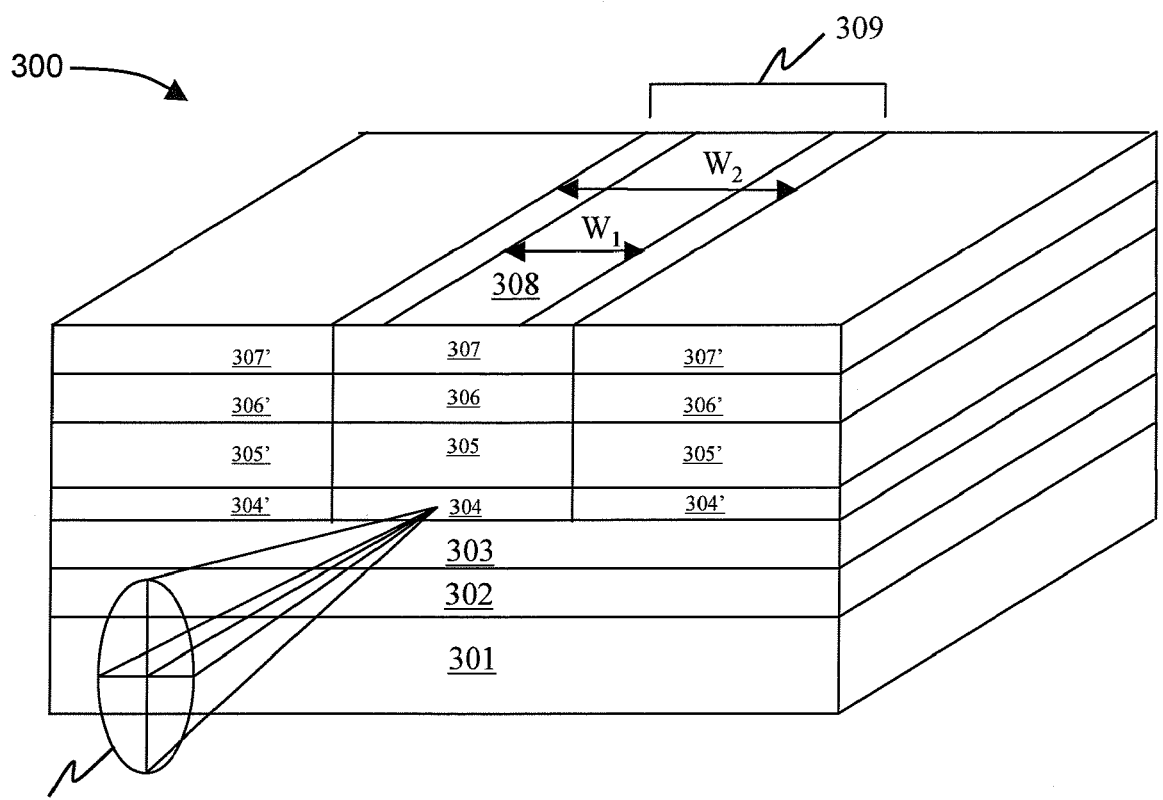
FIG. 3 is an isometric cross-sectional end view of an embodiment of a combination gain-guided and index guided laser according to instant invention.
Figure 4:
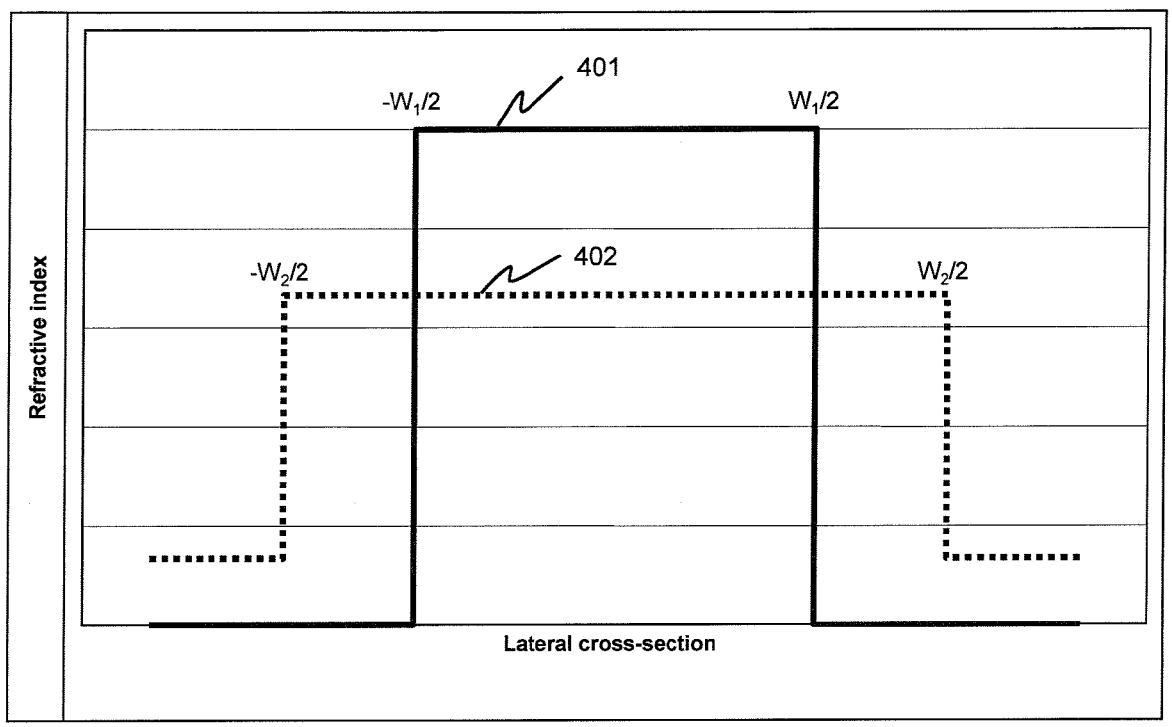
Figure 5:
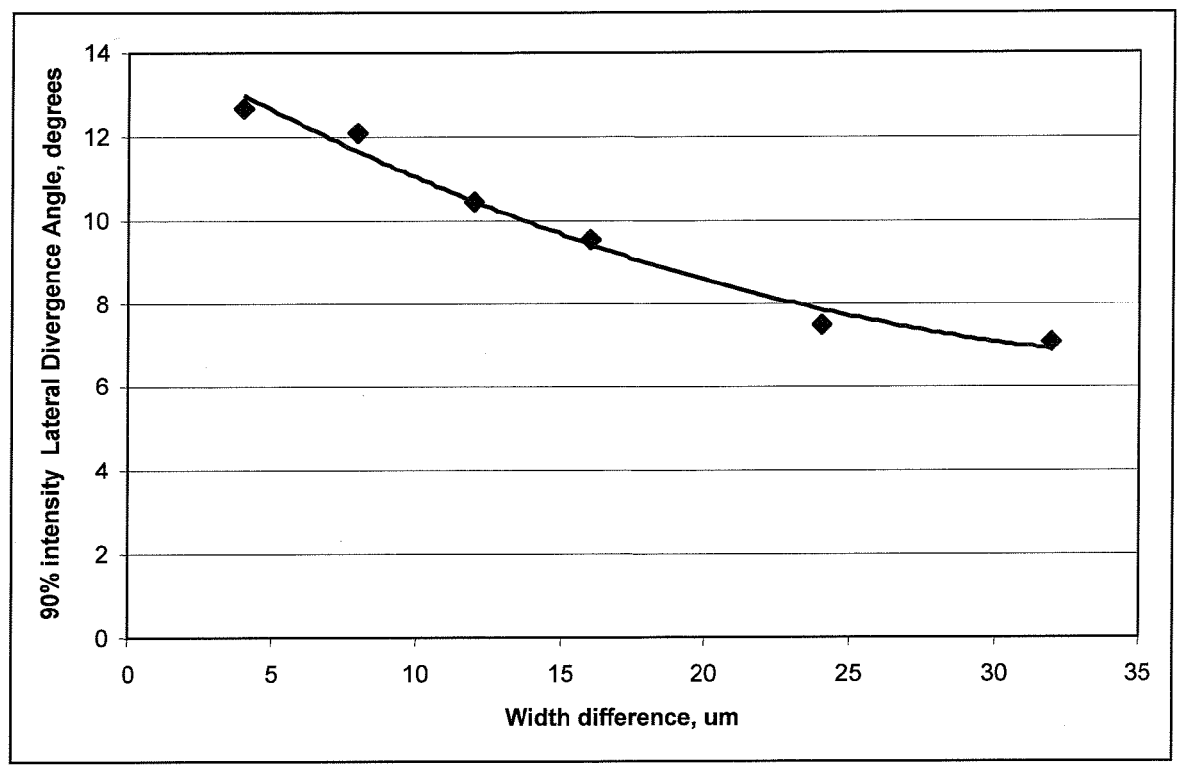
Figure 6:
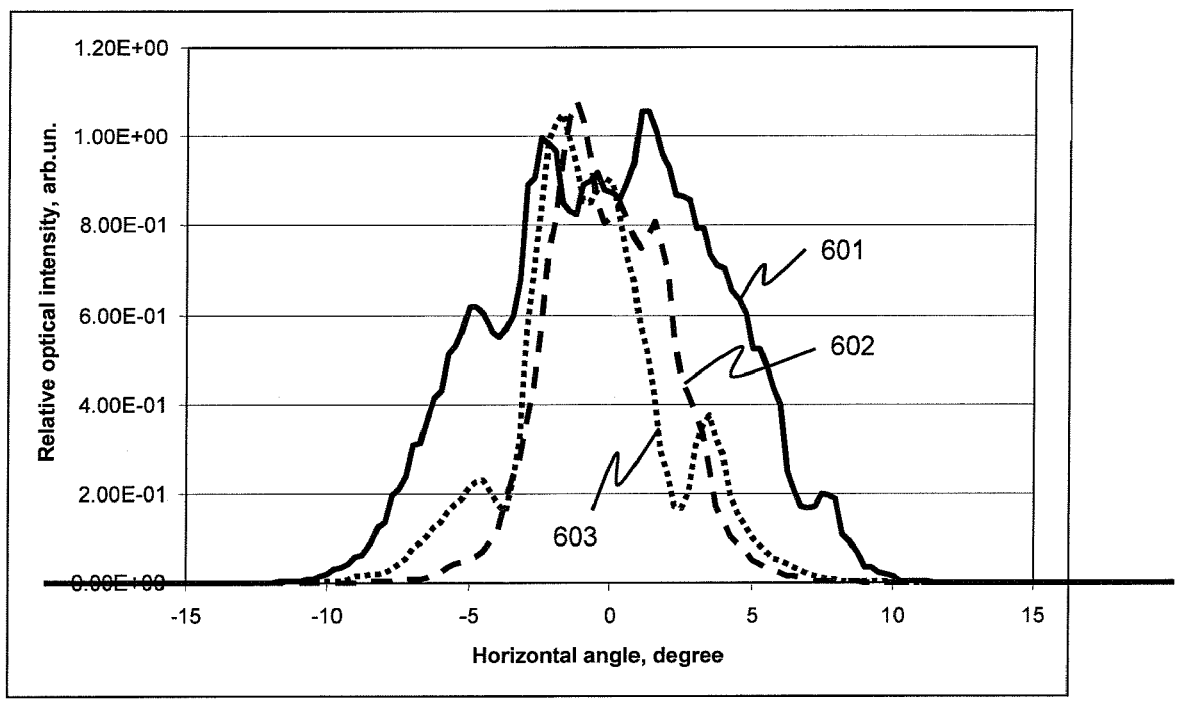
Figure 7:
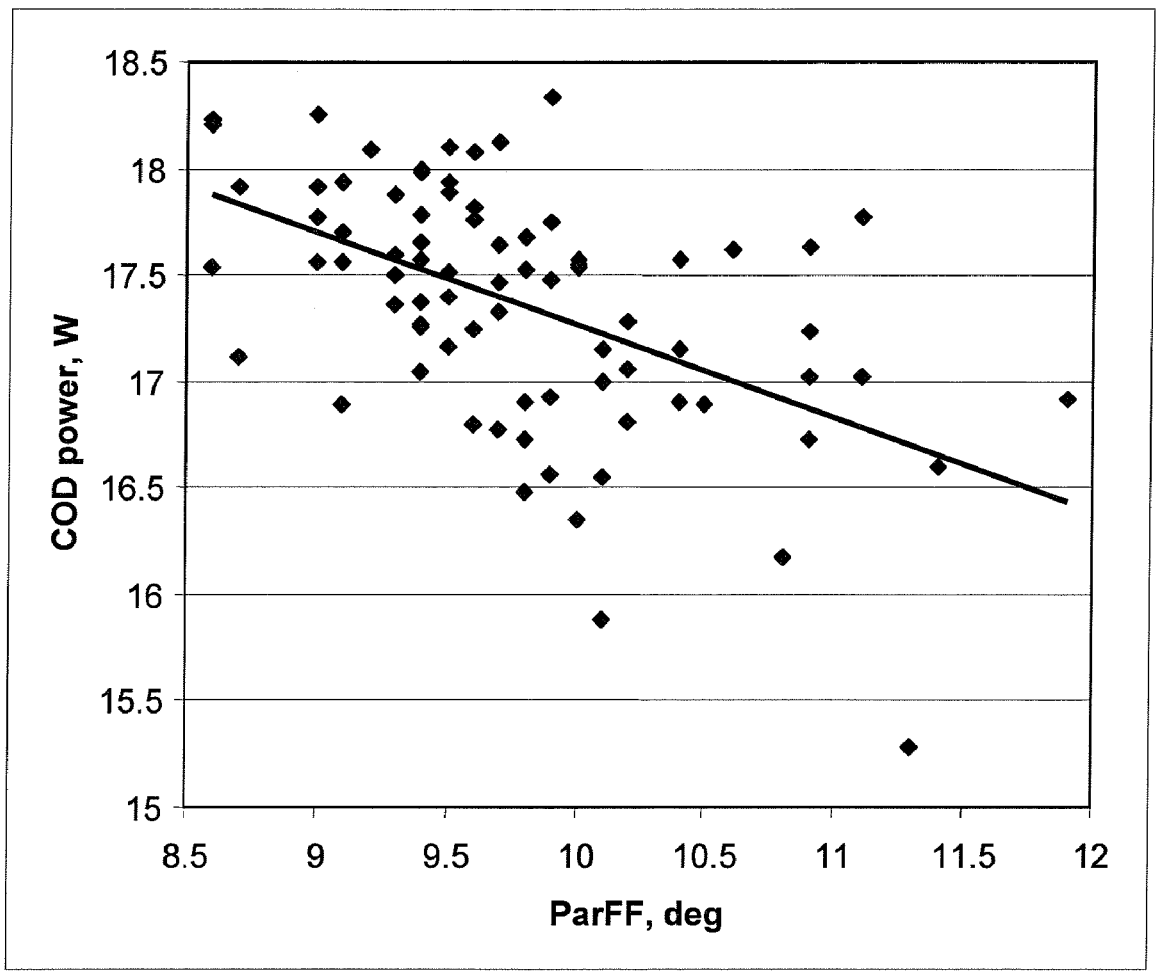

Shown in FIG. 4 is a lateral profile of pumping current and effective index for the structure in FIG. 3 (arbitrary units and scale);

FIG. 5 is a plot of the dependence of the average lateral divergence angle on the width difference between index-guided stripe and gain-guided stripe, $W_2-W_1$, for 830 nm broad area lasers;

FIG. 6 demonstrates that by increasing $W_2-W_1$, the side lobes in a typical multi-lobe far field become suppressed and power concentrates in a narrower angle;

In FIG. 7 the correlation between lateral far field angle, 90% of total intensity, and maximum COD power from typical 940 nm InGaAs/AlGaAs lasers is plotted.

DETAILED DESCRIPTION

To achieve a high power broad-area semiconductor laser structure with a reduced lateral divergence of the output beam, a structure combining the advantages of gain-guiding and index guiding are disclosed.

An embodiment of the invention is shown in isometric cross-sectional end view in FIG. 3. A semiconductor laser 300 comprises a planar substrate 301, on which a sequence of epitaxial layers is deposited to form an optical waveguide with a perpendicular index profile to guide an optical beam in a vertical or perpendicular direction. The sequence starts with a n-cladding layer 302, followed by a n-waveguide layer 303, an active layer 304, a p-waveguide layer 305, a p-cladding layer 306 and finally a cap layer 307. The active layer 304 may consist of one or more sub-layers such as quantum wells.

For index guiding the optical beam in a lateral direction parallel to the planar substrate 301, a lateral profile of refractive index is introduced with an index guiding region under an index-guided stripe 309 of width $W_2$, enclosed by a lateral confining region on either side. To fulfill optical guiding conditions in the lateral direction, an effective index in the index guiding region needs to be higher than in the lateral confining regions. This can be achieved by selectively modifying the index of refraction in regions of one or more of the various epitaxial layers, which form part of the optical waveguide. For example, in the lateral confining regions comprising lower index regions 304'-307', the refractive index is modified during laser fabrication so that it is lower than in the contiguous index guiding region comprising top four layers 304-307, respectively. Several techniques can be applied to modify the refractive index, such as selective etch and redeposition of material with different index, selectively changing the refractive index by vacancy induced disordering or impurity induced disordering. Thus, lower index active regions 304', lower index p-waveguide regions 305', lower index p-clad regions 306', and lower index cap regions 307' constitute regions with a lower refractive index, forming the lateral confining regions which provide lateral optical confinement for guiding an optical beam in the lateral direction. It should be noted that not every layer in the lower index regions 304'-307' needs to be modified to obtain a sufficient lateral profile of the effective index in order to fulfill the lateral optical guiding conditions.

The semiconductor laser 300 shown in cross-sectional end view in FIG. 3 requires reflectors at each end of the optical waveguide to create optical feedback, thus defining an optical cavity in which lasing of the optical beam can occur when optical gain in the active layer exceeds a certain threshold value. Typically the reflectors are provided by reflecting surfaces formed during dicing by cleaving the substrate along crystallographic planes. The reflecting surfaces can also be fabricated by etching a facet perpendicular to the plane of the substrate. Other reflectors for providing optical feedback known in the art are Bragg reflectors, and distributed feedback structures.

Electrical current is injected into the semiconductor laser 300 through an electrode in the form of a current injection stripe 308 of width $W_1$. At currents higher than the laser threshold current $I_{th}$, an optical gain g(I) is achieved inside a pumped region under the current injection stripe 308 of the semiconductor laser structure. A complex refractive index N inside the pumped region becomes different from that of surrounding unpumped regions. A contrast in complex refractive index thus created provides gain-guiding due to a current-induced lateral optical confinement, which complements the lateral optical confinement inherent in semiconductor material in the lower refractive index regions 304'-307'.

In the above description n- and p- refers to the semiconductor doping type. Laser structures may also be constructed with the n-type doping interchanged with p-type doping and vice-versa. The invention can be applied to uni-type structures such as quantum cascade lasers as well. In uni-type structures carrier injection into an optical gain region, such as in an active layer, does not rely on p-n junctions, but mostly on heterojunctions and other conduction and valence energy band engineered junctions. In other words, in uni-type lasers, epitaxial layers on either side of the active layer can have the same type, either n-type or p-type.

Various semiconductor material systems can be used for the structure described in FIG. 3. These may include GaAs/AlGaAs, InGaAs/AlGaAs, InP/InGaAsP, GaAsP/InGaAsP, GaAsP/InGaP and similar. The emission wavelength of lasers is primarily determined by the composition of the material used in the active layer 304. Typically, the range of wavelength lies between 800 nm and 940 nm for GaAs-based material systems.

FIG. 4 shows a lateral cross-section of pumping current induced refractive index change profile 401 and material refractive index profile 402 for the structure in FIG. 3 (arbitrary units and scale).

In prior art structures, the width of the current injection stripe is generally equal or very close to the width of the index-guided stripe. Typical values for the difference in width $W_2-W_1$ lie in the range from 0 μm to 5 μm for broad-area lasers with $W_2$, $W_1$ in the range of 20 μm-500 μm.

The present invention proposes a significant increase in the width of the index-guided stripe 309 compared to the width of the current injection stripe 308 that results in significant narrowing of the lateral divergence of the output laser beam. As an example, FIG. 5 shows a dependence of the lateral divergence of an 830 nm GaAs/AlGaAs broad area laser as a function of the difference, $W_2-W_1$, between the widths of the index-guided stripe 309 and current injection stripe 308. The 90% intensity lateral divergence angle in degrees is plotted as a function of the width difference, $W_2-W_1$, in micron (μm).

As the width difference $W_2-W_1$ between index-guided stripe 309 and current injection stripe 308 is increased from 4 μm to 34 μm, the lateral divergence angle is decreased by nearly factor of 2 from about 13° to about 7°. Here the lateral divergence angle is defined as an angle where 90% of total intensity is concentrated.

The lateral divergence angle can be deduced from the lateral far-field intensity profile of the laser output beam. In FIG. 6 lateral far field profiles for three lasers with different width differences $W_2-W_1$ are compared. The relative optical intensity in arbitrary units is plotted as a function of the lateral far-field (horizontal) angle in degrees. Curves 601, 602 and 603 correspond to differences of 4 μm, 16 μm and 34 μm, respectively.

Thus by increasing $W_2-W_1$, the side lobes in a typical multi-lobe far field become suppressed and power concentrates in a narrower lateral divergence angle. In the example structures, at $W_2-W_1$ greater than about 50 μm, the effect saturates and there is no further benefit.

Narrowing of lateral far field also improves maximum output power from broad-area lasers that is limited by catastrophic optical damage (COD). This correlation is shown in FIG. 7, in which the COD power in Watt is plotted against the lateral far-field angle, ParFF in degrees. The COD power is seen to increase statistically by about 10% as the lateral far field angle is reduced from about 12 degrees to about 8.5 degrees.

In summary, a broad-area semiconductor laser is disclosed. An embodiment of the broad-area semiconductor laser comprises a planar substrate, which supports an index guiding region with a plurality of epitaxial layers for guiding an optical beam in a lateral direction parallel to the substrate. The plurality of layers includes an active layer for providing optical gain, a first guiding layer above, and a second guiding layer below the active layer for providing optical confinement in a direction perpendicular to the planar substrate, and a cap layer on the first guiding layer for supporting an electrode.

Disposed on either side of the index guiding region are a first and a second lateral confining region defining a confinement width for confining the optical beam in a lateral direction.

An optical cavity is formed by first and second reflectors, advantageously reflecting surfaces, at either end of the plurality of layers.

A current injection electrode with a stripe width and mounted on the cap layer above the active layer, extends between the first and second reflectors or reflecting surfaces for injecting electrical current into the active layer.

To achieve a desired lateral narrowing of the optical beam in the broad-area semiconductor laser, the confinement width is made wider than the stripe width by at least 20 micron.

A method of fabricating the broad-area semiconductor laser is also disclosed. On a planar substrate a plurality of layers is epitaxially deposited. The plurality of layers includes an active layer for providing optical gain, upper and lower guiding layers for providing optical confinement in the perpendicular direction. An index guiding region with a confinement width is then formed along a lasing direction in the broad-area semiconductor laser for providing optical confinement in the lateral direction.

A current injection electrode having a stripe width, which is narrower than the confinement width is formed for injecting electrical current into the active layer of the broad-area semiconductor laser for generating optical gain.

Suitable materials for the broad-area semiconductor laser include compound semiconductors, typically from groups III and V of the periodic table, although other material systems could be used. The compound semiconductor materials of particular interest and usefulness are AlGaAs, GaAs, GaAsP, InP, InGaAs, InGaP, InGaAsP, GaAsP and InGaAsP. The actual choice of material system is usually determined by parameters of the broad-area semiconductor laser such as emission wavelength, operating power levels and efficiency.

We claim:

1. A broad-area semiconductor laser comprising:
   a planar substrate;
   an index guiding region comprising a plurality of epitaxial layers supported by the planar substrate for guiding an optical beam parallel to the substrate, the plurality of layers comprising:
   an active layer for providing optical gain;
   a first guiding layer above the active layer for providing optical confinement;
   a second guiding layer below the active layer for providing optical confinement; and
   a cap layer on the first guiding layer for supporting an electrode;
   first and second lateral confining regions, one on either side of, and in direct contact with the index guiding region defining a confinement width for guiding the optical beam in a lateral direction;
   first and second reflecting surfaces on either end of the plurality of layers defining an optical cavity; and
   a current injection electrode having a stripe width mounted on the cap layer above the active layer, and extending between the first and second reflecting surfaces for injecting electrical current into the active layer;
   wherein the confinement width is wider than the stripe width.

2. The broad-area semiconductor laser in claim 1, wherein the confinement width exceeds the stripe width by at least 20 µm.

3. The broad-area semiconductor laser in claim 1, wherein at least one of the plurality of epitaxial layers has a lower refractive index in the first and second confinement regions than in the index guiding region.

4. The broad-area semiconductor laser in claim 1, wherein the confinement width exceeds the stripe width by between about 20 µm and about 50 µm.

5. The broad-area semiconductor laser in claim 1, wherein the stripe width is between about 20 µm and about 500 µm.

6. The broad-area semiconductor laser in claim 2, further comprising a first confining layer disposed between the first guiding layer and the active layer and a second confining layer disposed between the second guiding layer and the active layer for providing carrier confinement.

7. The broad-area semiconductor laser in claim 2, wherein the plurality of layers comprises one or more of semiconductor materials AlGaAs, GaAs, GaAsP, InP, InGaAs, InGaP, InGaAsP, GaAsP and InGaAsP.

8. The broad-area semiconductor laser in claim 2, wherein the planar substrate and the second guiding layer comprise n-type semiconductor, and the first guiding layer comprises p-type semiconductor.

9. The broad-area semiconductor laser in claim 2, wherein the planar substrate and the second guiding layer comprise p-type semiconductor, and the first guiding layer comprises n-type semiconductor.

10. The broad-area semiconductor laser in claim 6, wherein the planar substrate, the second guiding layer and the second confining layer comprise n-type semiconductor, and the first guiding layer and the first confining layer comprise p-type semiconductor.

11. The broad-area semiconductor laser in claim 6, wherein the planar substrate, the second guiding layer and the second confining layer comprise p-type semiconductor, and the first guiding layer and the first confining layer comprise n-type semiconductor.

* * * * *